(12) United States Patent
Jinbo et al.

(10) Patent No.: US 8,823,030 B2
(45) Date of Patent: Sep. 2, 2014

(54) LIGHT-EMITTING DEVICE AND LIGHTING DEVICE

(75) Inventors: Yasuhiro Jinbo, Kanagawa (JP); Kensuke Yoshizumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/560,046

(22) Filed: Jul. 27, 2012

(65) Prior Publication Data

US 2013/0032841 A1    Feb. 7, 2013

(30) Foreign Application Priority Data

Aug. 4, 2011    (JP) .................................. 2011-170906

(51) Int. Cl.
*H01L 33/00*    (2010.01)
(52) U.S. Cl.
USPC ............... 257/98; 257/E33.072; 257/E33.073
(58) Field of Classification Search
USPC ............................. 257/98, E33.072, E33.073
See application file for complete search history.

(56) References Cited

U.S. PATENT DOCUMENTS

| | | | |
|---|---|---|---|
| 6,847,163 B1 | 1/2005 | Tsutsui et al. | |
| 7,462,883 B2 | 12/2008 | Kumaki et al. | |
| 7,554,265 B2 | 6/2009 | Godo et al. | |
| 7,564,052 B2 | 7/2009 | Kumaki et al. | |
| 7,601,988 B2 | 10/2009 | Seo et al. | |
| 7,737,626 B2 | 6/2010 | Kumaki et al. | |
| 7,851,989 B2 | 12/2010 | Noda | |
| 7,875,893 B2 | 1/2011 | Seo et al. | |
| 7,893,427 B2 | 2/2011 | Kumaki et al. | |
| 7,964,891 B2 | 6/2011 | Kumaki et al. | |
| 8,008,652 B2 | 8/2011 | Kumaki et al. | |
| 2006/0163597 A1 | 7/2006 | Noda et al. | |
| 2006/0284204 A1 | 12/2006 | Yamazaki et al. | |
| 2007/0001570 A1 | 1/2007 | Nomura et al. | |
| 2007/0035243 A1 | 2/2007 | Lee | |
| 2007/0176161 A1 | 8/2007 | Seo et al. | |
| 2008/0241586 A1 | 10/2008 | Kumaki et al. | |
| 2009/0275161 A1 | 11/2009 | Kumaki et al. | |
| 2011/0101345 A1 | 5/2011 | Kumaki et al. | |
| 2011/0101380 A1 | 5/2011 | Kumaki et al. | |
| 2011/0108864 A1 | 5/2011 | Seo et al. | |
| 2011/0140101 A1 | 6/2011 | Noda | |
| 2011/0241007 A1 | 10/2011 | Kumaki et al. | |
| 2011/0278562 A1 | 11/2011 | Kumaki et al. | |

(Continued)

FOREIGN PATENT DOCUMENTS

JP    2004-63349    2/2004

*Primary Examiner* — David S Blum
(74) *Attorney, Agent, or Firm* — Husch Blackwell LLP

(57) ABSTRACT

A light-emitting device which has various emission colors and can be manufactured efficiently and easily is provided. A first conductive layer formed of a semi-transmissive and semi-reflective conductive film is provided in a first light-emitting element region, so that the intensity of light in a specific wavelength region is increased with a cavity effect. As a result, the light-emitting device as a whole can emit desired light. When the first conductive layer is formed using a material with low electric resistance, voltage drop in a transparent conductive layer in the light-emitting device can be prevented. Accordingly, a light-emitting device with less emission unevenness can be manufactured. By applying such a structure to a white-light-emitting device, desired white light emission or white light emission with an excellent color rendering property can be obtained. Further, a large-area lighting device including a white-light-emitting device with less emission unevenness can be provided.

23 Claims, 6 Drawing Sheets

(56) References Cited

U.S. PATENT DOCUMENTS

| | | |
|---|---|---|
| 2011/0291088 A1 | 12/2011 | Seo et al. |
| 2011/0309351 A1 | 12/2011 | Kumaki et al. |
| 2012/0205676 A1 | 8/2012 | Seo et al. |
| 2012/0205685 A1 | 8/2012 | Seo et al. |
| 2012/0205686 A1 | 8/2012 | Seo et al. |
| 2012/0206675 A1 | 8/2012 | Seo et al. |
| 2012/0273822 A1* | 11/2012 | Ohsawa et al. .................. 257/98 |
| 2012/0281408 A1* | 11/2012 | Owen et al. .............. 362/249.01 |

* cited by examiner

LIGHT-EMITTING DEVICE AND LIGHTING DEVICE

BACKGROUND OF THE INVENTION

1. Field of the Invention

The present invention relates to a light-emitting device and a lighting device. In particular, the present invention relates to a light-emitting device and a lighting device to which a light-emitting element utilizing electroluminescence is applied.

2. Description of the Related Art

In recent years, research has been conducted on light-emitting devices including organic electroluminescence (hereinafter, referred to as EL) elements, which utilize EL, as self-luminous light-emitting elements. An organic EL element can provide surface light emission with a large area because a pair of electrodes and a light-emitting layer are formed in film forms. Since an organic EL element can provide surface light emission, application of the organic EL element to a light source such as a lighting device or a backlight source of a liquid crystal display device has been attempted.

For obtaining light emission of a desired color with the use of an organic EL element, for example, an organic EL element including a light-emitting layer formed of a plurality of stacked layers whose emission colors are different from each other (which have different emission spectra) is formed. The emission spectrum of an organic EL element including such a light-emitting layer corresponds to a combination of a plurality of emission spectra; thus, light emission of a desired color can be obtained.

For obtaining white light emission, for example, a white-light-emitting organic EL element including a light-emitting layer formed of a plurality of stacked layers is used; examples of the white-light-emitting organic EL element include a three-wavelength-type white organic EL element in which layers emitting red light, green light, and blue light (three primary colors of light) are stacked, and a two-wavelength-type white organic EL element in which layers emitting light of complementary colors (e.g., blue and yellow orange) are stacked. In each of these elements, a plurality of emission spectra is combined, so that white light emission is obtained.

In order that an organic EL element emits light of a desired color, the peak intensities of respective emission spectra, the shapes of the spectra, and the balance therebetween are optimized. For example, Patent Document 1 discloses a technique for obtaining objective white light emission by setting the thickness of an organic light-emitting layer, the proportion of a guest material in a host material, the thickness of a hole-transport layer, and the thickness of an electron-transport layer.

The color tone of light emitted from a lighting device is required to be suitable for the intended use in some cases. For example, the color temperature for use in homes and that in offices are different from each other. Further, for display in retail stores, not only white light emission but also light emission of other various colors is required in some cases.

REFERENCE

Patent Document

[Patent Document 1] Japanese Published Patent Application No. 2004-063349

SUMMARY OF THE INVENTION

Since an organic EL element can be adapted to a variety of uses, an element emitting light of a variety of colors is needed.

However, time and effort are necessary to form conventional organic EL elements emitting light of desired colors in which, for example, different guest materials are used in different host materials and the thicknesses of organic light-emitting layers are adjusted to be varied depending on the organic EL elements. As a result, a reduction in cost is difficult.

In view of the above, an object of one embodiment of the present invention is to provide a light-emitting device which has various emission colors and can be manufactured efficiently and easily.

In order to achieve the above object, the present invention focuses on the fact that the emission color of a light-emitting element in which a layer containing a light-emitting organic compound (hereinafter, referred to as electroluminescence (EL) layer) is sandwiched between a pair of electrodes differs depending on the structure of the pair of electrodes. Specifically, the emission color of a light-emitting element in which one EL layer is sandwiched between a reflective electrode layer and a semi-transmissive and semi-reflective electrode layer is different from that of a light-emitting element in which the one EL layer is sandwiched between a reflective electrode layer and a transparent conductive layer. The reason of this is as follows: a microresonator structure (also referred to as microcavity structure) formed with the reflective electrode layer and the semi-transmissive and semi-reflective electrode layer enables light with a specific wavelength emitted from the EL layer to be easily extracted to the outside of the light-emitting element, and as a result, the shape of the emission spectrum is changed so that the emission color can be changed.

The present inventors have conceived a light-emitting device in which an EL layer is sandwiched between a reflective electrode layer and a transparent conductive layer. In the light-emitting device, a first light-emitting element region which includes a first conductive layer having a semi-transmissive and semi-reflective property in contact with the transparent conductive layer and a second light-emitting element region which does not include the first conductive layer having a semi-transmissive and semi-reflective property are provided.

The emission color of the light-emitting device with such a structure can be variously changed by adjusting the ratio of the area of the first light-emitting element region to that of the second light-emitting element region. Note that the ratio can be easily adjusted by changing the area of a region where the first conductive layer having a semi-transmissive and semi-reflective property and the reflective electrode layer overlap with each other.

That is, one embodiment of the present invention is a light-emitting device including a first light-emitting element region and a second light-emitting element region. In both the first light-emitting element region and the second light-emitting element region, an EL layer is sandwiched between a reflective electrode layer and a transparent conductive layer. The first light-emitting element region includes a first conductive layer having a semi-transmissive and semi-reflective property in contact with the transparent conductive layer.

In the light-emitting device, light emission from the first light-emitting element region and light emission from the second light-emitting element region are performed concurrently; thus, the emission spectrum of the light-emitting device is a combination of the emission spectrum of the first light-emitting element region and the emission spectrum of the second light-emitting element region. Since the first light-emitting element region includes the first conductive layer with a semi-transmissive and semi-reflective property overlapping with the reflective electrode layer, a resonator effect (cavity effect) is generated, and thus the intensity of light with a specific wavelength emitted from the EL layer between the first conductive layer and the reflective electrode layer can be increased. In this manner, by forming the first conductive layer in the first light-emitting element region, the color of light emitted from the light-emitting device can be easily made a desired color.

Another embodiment of the present invention is the light-emitting device in which the electric resistance of the first conductive layer is lower than that of the transparent conductive layer.

Since the electric resistance of the first conductive layer is lower than that of the transparent conductive layer, voltage drop in the transparent conductive layer can, be prevented. As a result, a light-emitting device with less emission unevenness can be provided.

Another embodiment of the present invention is the light-emitting device in which, in the first light-emitting element region, an optical path length is adjusted so that the intensity of light in a specific wavelength region is relatively increased due to the presence of the first conductive layer, and the emission color of the first light-emitting element region and the emission color of the second light-emitting element region are complementary colors.

In the first light-emitting element region including the first conductive layer, the intensity of light in a specific wavelength region emitted from the EL layer is relatively increased. The color of the light in the specific wavelength region and that of light emitted from the second light-emitting element region are made complementary colors. By increasing the intensity of light emitted from the first light-emitting element region, the balance between light emission from the first light-emitting element region and that from the second light-emitting element region can be adjusted; thus, light emitted from the light-emitting device as a whole can be close to desired white light having, for example, CIE chromaticity coordinates of (x=0.33, y=0.33).

Another embodiment of the present invention is the white-light-emitting device in which the optical path length is adjusted so that the intensity of blue light is relatively increased due to the presence of the first conductive layer in the first light-emitting element region.

For example, in an EL device emitting white light with the use of red light, green light, and blue light, when the intensity of blue light is lower than that of red light and that of green light, yellowish white light is emitted. In view of this, in the first light-emitting element region including the first conductive layer, the optical path length is adjusted so that the intensity of blue light is relatively increased due to the presence of the first conductive layer; thus, the balance among emission spectra of red light, green light, and blue light can be adjusted. As a result, the light-emitting device as a whole can emit light close to desired white light having, for example, CIE chromaticity coordinates of (x=0.33, y=0.33).

Another embodiment of the present invention is the light-emitting device in which a plurality of lenses overlapping with the first light-emitting element region and the second light-emitting element region is arrayed.

With the lenses, light emission from the first light-emitting element region and light emission from the second light-emitting element region can be effectively mixed so that the spectral shape can be close to that of natural light; in this manner, white light with an excellent color rendering property can be provided.

Another embodiment of the present invention is a lighting device including the light-emitting device.

By providing the first conductive layer in the light-emitting device, the emission color of the light-emitting device can be adjusted to be a desired color. Further, voltage drop in the transparent conductive layer is difficult to occur in the light-emitting device; thus, a lighting device with less emission unevenness can be provided.

According to one embodiment of the present invention, a light-emitting device having various emission colors can be provided. Further, according to one embodiment of the present invention, a light-emitting device having various emission colors can be provided efficiently and easily.

DETAILED DESCRIPTION OF THE INVENTION

Hereinafter, embodiments of the invention disclosed in this specification will be described in detail with reference to the accompanying drawings. However, the invention disclosed in this specification is not limited to the description below, and it is easily understood by those skilled in the art that modes and details disclosed herein can be modified in various ways. Further, the invention disclosed in this specification should not be construed as being limited to the description in the following embodiments.

[Embodiment 1]

A structure of a light-emitting device according to one embodiment of the present invention will be described with reference to FIGS. 1A to 1C.

Figure 1A:
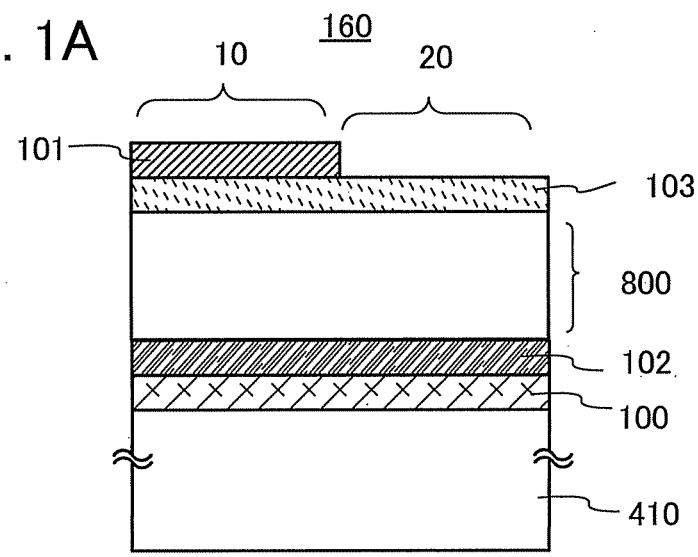
FIGS. 1A to 1C are cross-sectional views illustrating a light-emitting device according to one embodiment of the present invention.

FIG. 1A illustrates a light-emitting device 160, which is a cross-sectional view schematically illustrating a light-emitting device according to one embodiment of the present invention. A first light-emitting element region 10 includes a reflective electrode layer 100, a second conductive layer 102, an EL layer 800, a transparent conductive layer 103, and a first conductive layer 101. A second light-emitting element region 20 includes the reflective electrode layer 100, the second conductive layer 102, the EL layer 800, and the transparent conductive layer 103. The light-emitting device 160 is formed over a substrate 410. The light-emitting device 160 can be supplied with power by being connected to an external power source through the reflective electrode layer 100 and the second conductive layer 102 as one electrode and the transparent conductive layer 103 and the first conductive layer 101 as the other electrode.

Figure 1B:
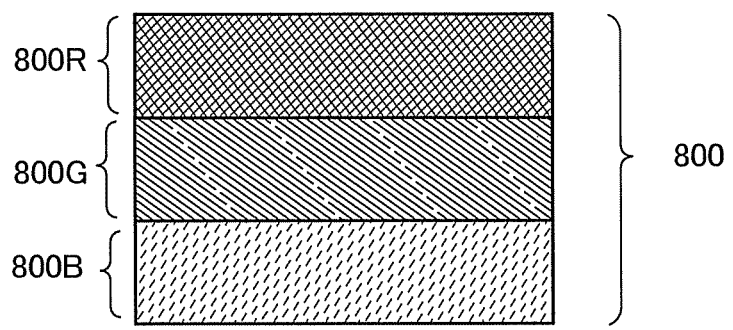
Figure 1C:
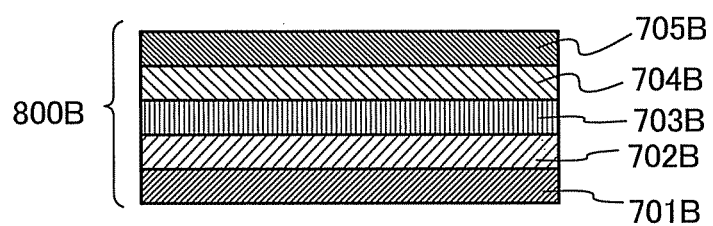

In this embodiment, the case where the EL layer 800 is formed of three layers, an EL layer 800B, an EL layer 800G, and an EL layer 800R, is described (FIG. 1B). The EL layer 800B emits blue light, the EL layer 800G emits green light, and the EL layer 800R emits red light. Note that in this specification and the like, blue light has an emission spectrum in which the intensity at a wavelength of 450 nm to 485 nm is higher than that at the other wavelengths of visible light, green light has an emission spectrum in which the intensity at a wavelength of 500 nm to 565 nm is higher than that at the other wavelengths of visible light, and red light has an emission spectrum in which the intensity at a wavelength of 600 nm to 740 nm is higher than that at the other wavelengths of visible light.

In this embodiment, in the first light-emitting element region 10, the intensity of blue light emitted from the EL layer 800B is increased to be higher than the intensity of light of other colors with a cavity effect generated by the reflective electrode layer 100 and the first conductive layer 101. The method is described below.

A specific wavelength of blue light emitted from the EL layer 800B is assumed to be λ. In addition, the distance between the reflective electrode layer 100 and the first conductive layer 101 is assumed to be, h, the optical path length between the reflective electrode layer 100 and the first conductive layer 101 is assumed to be L, and the sum of a phase shift generated due to reflection from the reflective electrode layer 100 and a phase shift generated due to reflection from the first conductive layer 101 is assumed to be φ radian. Note that the optical path length L is obtained by multiplying the distance h between the reflective electrode layer 100 and the first conductive layer 101 by the refractive index n of the EL layer sandwiched between the reflective electrode layer 100 and the first conductive layer 101 (Formula (1)). The phase shift φ can be obtained using the refractive indexes of the reflective electrode layer 100 and the first conductive layer 101, the absorption coefficients thereof, and the refractive index n of the EL layer sandwiched between a pair of these electrodes.

$$L = h \times n \qquad \text{(Formula 1)}$$

In order to relatively intensify blue light which has the wavelength λ and is emitted from the EL layer 800B, the distance h between the reflective electrode layer 100 and the first conductive layer 101 may be adjusted so that Formula (2) below can be satisfied. As a result, in the first light-emitting element region 10, the intensity of light having the wavelength λ is increased with the cavity effect.

$$(2L)/\lambda + \phi/(2\pi) = N \text{ (}N \text{ is an integer)} \qquad \text{(Formula 2)}$$

<Light Emission from the Light-Emitting Device 160>

In an EL device emitting white light with the use of red light, green light, and blue light, when the intensity of blue light is lower than that of red light and that of green light, yellowish white light is emitted. On the other hand, in the first light-emitting element region 10, the intensity of blue light is relatively increased with the cavity effect as described above.

In the light-emitting device 160, light emission from the first light-emitting element region 10 and light emission from the second light-emitting element region 20 are performed concurrently; thus, light emission from the light-emitting device 160 is a combination of light emission from the first light-emitting element region 10 and light emission from the second light-emitting element region 20. With the cavity effect, the intensity of blue light is relatively increased in light emission from the first light-emitting element region 10. For that reason, in light emission from the light-emitting device 160, the intensity of blue light can be increased and a balance with emission spectra of other colors can be adjusted; therefore, emitted light from the light-emitting device 160 can be close to desired white light having, for example, CIE chromaticity coordinates of (x=0.33, y=0.33). Since the intensity of blue light becomes relatively high, the spectral shape in the visible light region is improved. As a result, a light-emitting device emitting white light with an excellent color rendering property can be provided.

In order that the light-emitting device as a whole emits light of a desired color or white light with an excellent color rendering property, the ratio of the area of the first light-emitting element region 10 to that of the second light-emitting element region 20 may be set so that, for example, the intensity of blue light has an appropriate value.

Although the intensity of blue light is increased in this embodiment, the method for obtaining desired white light emission is not limited to this; the distance h between the reflective electrode layer 100 and the first conductive layer 101 may be set so as to relatively intensify light having low intensity in the emission spectrum of the light-emitting element emitting white light formed of a plurality of colors. The ratio of the area of the first light-emitting element region 10 to that of the second light-emitting element region 20 may be set so that light emitted from the light-emitting device as a whole is close to desired white light having, for example, CIE chromaticity coordinates of (x=0.33, y=0.33), or so that the spectral shape of light emitted from the light-emitting device as a whole becomes that of white light close to natural light.

Although the white-light-emitting device is described in this embodiment, a light-emitting element emitting only light with a specific wavelength may be employed. With the cavity effect generated by the reflective electrode layer 100 and the first conductive layer 101, the intensity of light in a desired wavelength region emitted from the EL layer can be increased in the first light-emitting element region 10. As a result, light emission of a desired color can be obtained.

Figure 2A:
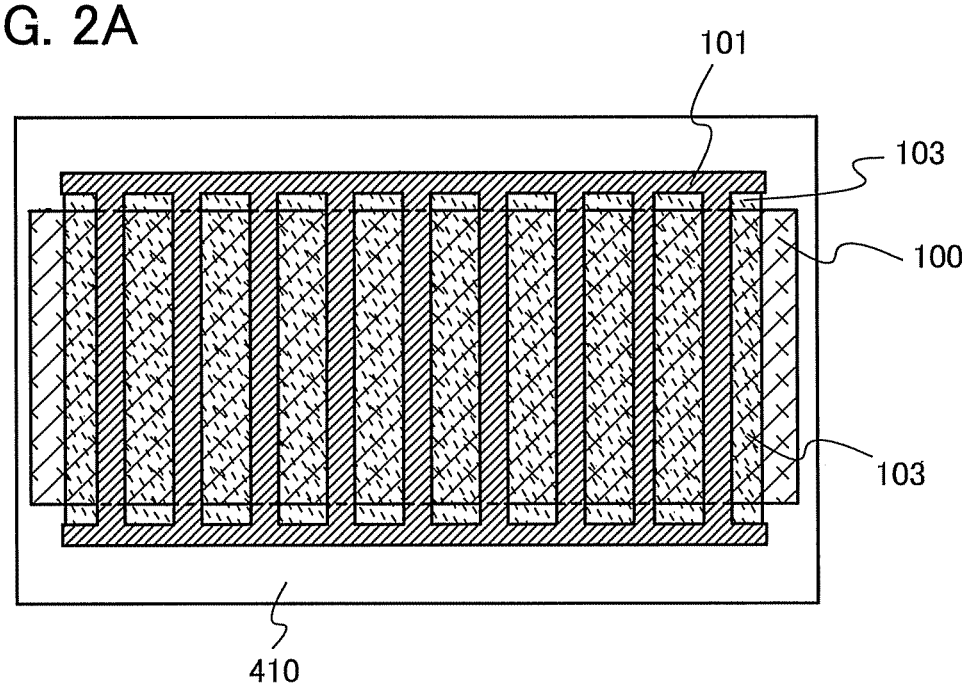
FIGS. 2A and 2B are plan views each illustrating a light-emitting device according to one embodiment of the present invention.
Figure 2B:
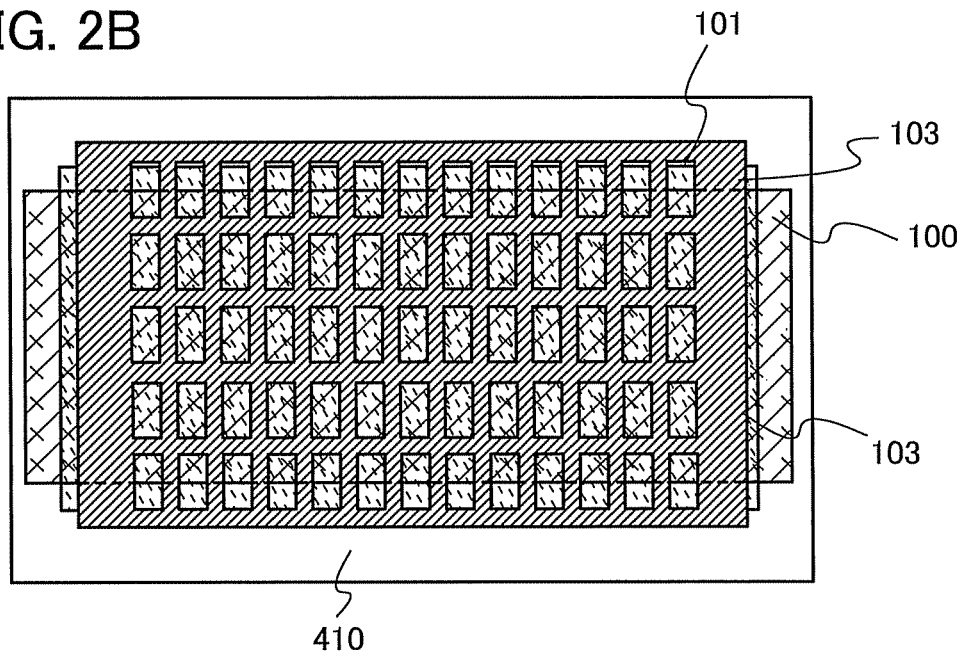

The first conductive layer 101 is preferably formed using a material whose electric resistance is lower than that of the transparent conductive layer 103. The first conductive layer 101 is formed so as to have a stripe shape (FIG. 2A) or a grid shape (FIG. 2B) in the light-emitting device, whereby voltage drop in the transparent conductive layer 103 in the light-emitting device can be prevented. As a result, a light-emitting device with less emission unevenness can be manufactured. In particular, such a structure is suitable for a lighting device with a large light-emitting area.

As described below, the first conductive layer 101 can be formed by an evaporation method or a sputtering method with the use of a metal mask or the like. Therefore, the first light-emitting element region 10 can be easily provided. As a result, a light-emitting device emitting light of a desired color can be manufactured efficiently and easily.

The details of the layers included in the light-emitting device of this embodiment will be described below.

<Structures of Electrodes>

(First Conductive Layer)

Figure 6A:
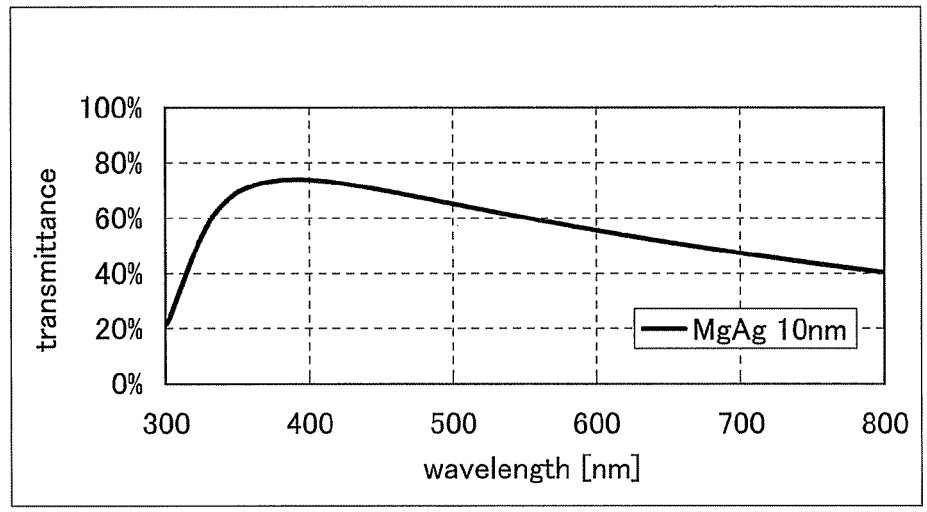
FIGS. 6A to 6C illustrate characteristics of a film used for one embodiment of the present invention.
Figure 6B:
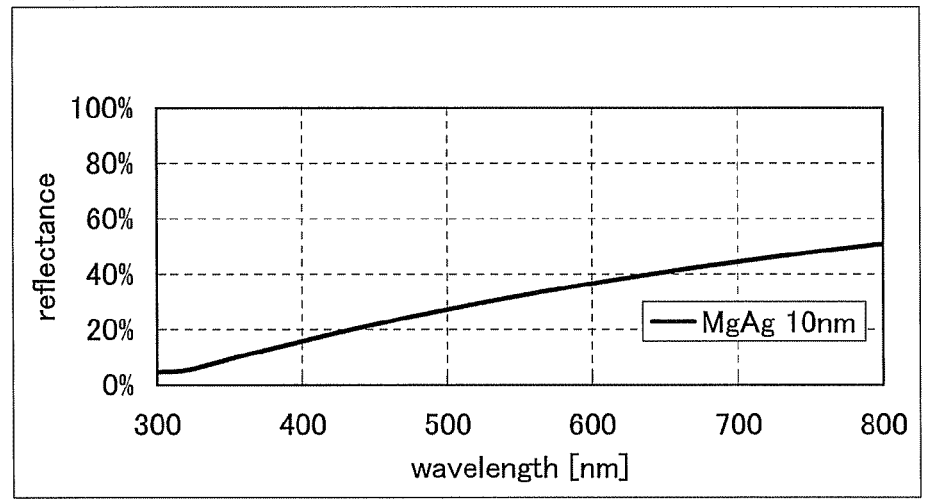
Figure 6C:
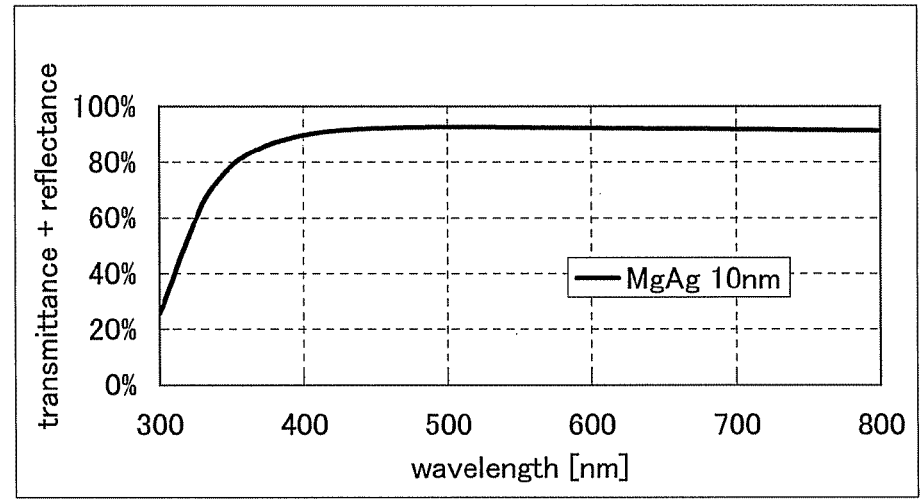

The first conductive layer 101 is formed in contact with the transparent conductive layer 103. The area of a region where the first conductive layer 101 is formed and the shape of the region may be set so that the light-emitting device as a whole emits light of a desired color. The first conductive layer 101 is formed of a semi-transmissive and semi-reflective conductive film. The first conductive layer 101 may be fanned using a semi-transmissive and semi-reflective film formed of an alloy of Mg:Ag (an alloy of magnesium and silver) or an alloy of Mg:In (an alloy of magnesium and indium), or may be formed using a semi-transmissive and semi-reflective film formed by co-evaporating an element belonging to Group 1 or Group 2 of the periodic table and aluminum. As the semi-transmissive and semi-reflective film, a film having a transmittance of 20% to 75% and a reflectance of 4% to 55% at a wavelength of 300 nm to 800 nm can be used, for example. FIGS. 6A to 6C show the transmittance, the reflectance, and the sum of the transmittance and the reflectance of a Mg:Ag thin film having a mass ratio of 1:10 (=Mg:Ag) and a film thickness of 10 nm, as one example. Here, in order that light emission from the first light-emitting element region 10 is performed by transmitting light through the first conductive layer 101, a Mg:Ag film with a thickness of 1 nm to 10 nm is used through which light is transmitted. The first conductive layer 101 can be formed by a vacuum evaporation method or a sputtering method with the use of a metal mask. Accordingly, a light-emitting device with a variety of emission colors can be easily manufactured.

(Reflective Electrode Layer)

The reflective electrode layer 100 may be formed over a substrate such as a glass substrate, a resin substrate, or a metal substrate. The reflective electrode layer 100 can be formed using a metal film with high reflectance. The metal film with high reflectance can be formed with a single-layer structure or a layered structure using aluminum, silver, an alloy containing such a metal material, or the like. Examples of an alloy containing aluminum include an alloy of Al:Ni:La (alloy of aluminum, nickel, and lanthanum), an alloy of Al:Ni:La:Cu (alloy of aluminum, nickel, lanthanum, and copper), an alloy of Al:Ni:La:Nd (alloy of aluminum, nickel, lanthanum, and neodymium), and an alloy of Al:Ni:La:Ge (alloy of aluminum, nickel, lanthanum, and germanium). These alloys have high planarity, and thus are suitable for a reflective electrode. Further, a layered structure of a metal film with high reflectance and another metal film with a small thickness (preferably 20 nm or less, more preferably 10 nm or less) may be employed. For example, a thin titanium film is preferably formed because formation of an insulating film between the EL layer 800 to be formed later and a metal (e.g., aluminum, alloy containing aluminum, or silver) film with high reflectance can be prevented. The thin metal film may be oxidized; in that case, a material that is less likely to have an insulating property even when it is oxidized, such as titanium or molybdenum, is preferably used. The reflective electrode layer 100 can be formed by a sputtering method or a vacuum evaporation method.

(Second Conductive Layer)

The second conductive layer 102 is formed in contact with the reflective electrode layer 100. The second conductive layer 102 functions as either or both a layer for injecting carriers to the EL layer or/and a film for adjusting the optical path length. The second conductive layer 102 is preferably formed using a conductive material having a property of transmitting visible light.

Specifically, the second conductive layer 102 can be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$; abbreviated to ITO), indium zinc oxide ($In_2O_3$—ZnO), or any of these metal oxide materials containing silicon oxide can be used. The second conductive layer 102 can be formed by a sputtering method.

In this embodiment, the second conductive layer 102 is provided in both the first light-emitting element region 10 and the second light-emitting element region 20; however, the second conductive layer 102 is not necessarily provided in both of them, and may be provided only in the first light-emitting element region 10 or only in the second light-emitting element region 20. In the case where the second conductive layer 102 is not processed into an island shape, there is an advantage that the number of steps can be made small.

(Transparent Conductive Layer)

The transparent conductive layer 103 is formed in contact with the EL layer 800 to be described later. The transparent conductive layer 103 can be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$; abbreviated to ITO), indium zinc oxide ($In_2O_3$—ZnO), or any of these metal oxide materials containing silicon oxide can be used. The transparent conductive layer 103 can be formed by a sputtering method.

<EL Layer>

(EL Layer 800)

In this embodiment, the following case is described: the EL layer 800B emits blue light, the EL layer 800G emits green light, and the EL layer 800R emits red light. The EL layer 800B includes a hole-injection layer 701B, a hole-transport layer 702B, an organic light-emitting layer 703B, an electron-transport layer 704B, and an electron-injection layer 705B; the EL layer 800G includes a hole-injection layer 701G, a hole-transport layer 7026, an organic light-emitting layer 703G, an electron-transport layer 704Q and an electron-injection layer 705G; and the EL layer 800R includes a hole-injection layer 701R, a hole-transport layer 702R, an organic light-emitting layer 703R, an electron-transport layer 704R, and an electron-injection layer 705R. The hole-injection layers, the hole-transport layers, the organic light-emitting layers, the electron-transport layers, and the electron-injection layers may be formed using appropriate materials so that desired emission colors can be obtained. An example of a layered structure of the EL layer 800B is illustrated in FIG. 1C. The hole-injection layer 701B, the hole-transport layer 702B, the organic light-emitting layer 703B, the electron-transport layer 704B, and the electron-injection layer 705B may be formed in this order. The hole-injection layer, the hole-transport layer, the organic light-emitting layer, the electron-transport layer, and the electron-injection layer that can be used for the EL layer are described below.

(Hole-Injection Layer)

The hole-injection layer 701 is a layer containing a substance having an excellent hole-injection property. As the substance having an excellent hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as copper (II) phthalocyanine (abbreviation: CuPc) can also be used.

In addition, an aromatic amine compound, which is a low-molecular organic compound, or the like can be used.

Further, a high-molecular compound in which a main chain or a side chain includes an aromatic amine, a carbazole derivative, or the like can also be used. A high-molecular compound to which acid is added can also be used.

In particular, for the hole-injection layer 701, a composite material in which an organic compound having an excellent hole-transport property is mixed with an electron acceptor substance is preferably used. With the use of the composite material in which a substance having an excellent hole-transport property is mixed with an electron acceptor substance, excellent hole injection from the second conductive layer 102 can be obtained, which results in a reduction in driving voltage of the light-emitting element. Such a composite material can be formed by co-evaporation of a substance having an excellent hole-transport property and an electron acceptor substance. When the hole-injection layer 701 is formed using the composite material, holes are easily injected into the EL layer 800 from the second conductive layer 102.

As the organic compound for the composite material, any of a variety of compounds such as a low-molecular compound (an aromatic amine compound, a carbazole derivative, an aromatic hydrocarbon, or the like) and a high-molecular compound in which a main chain or a side chain includes an aromatic amine, a carbazole derivative, or the like can be used. The organic compound used for the composite material is preferably an organic compound having an excellent hole-transport property. Specifically, a substance having a hole mobility of $10^{-6}$ cm$^2$/Vs or higher is preferably used. Note that any other substance may be used as long as the hole-transport property thereof is higher than the electron-transport property thereof.

Examples of an electron acceptor substance include organic compounds and transition metal oxides. Other examples are oxides of metals belonging to Groups 4 to 8 of the periodic table. Specifically, vanadium oxide, niobium oxide, tantalum oxide, chromium oxide, molybdenum oxide, tungsten oxide, manganese oxide, and rhenium oxide are preferable because of their excellent electron-accepting properties. Among these, molybdenum oxide is particularly preferable because it is stable in the air, has a low hygroscopic property, and is easily handled.

(Hole-Transport Layer)

The hole-transport layer 702 is a layer which contains a substance having an excellent hole-transport property. As the substance having an excellent hole-transport property, an aromatic amine compound can be used, for example. The substances mentioned here are mainly ones that have a hole mobility of $10^{-6}$ cm$^2$/Vs or higher. Note that any other substance may be used as long as the hole-transport property thereof is more excellent than the electron-transport property thereof. Note that the layer containing a substance having an excellent hole-transport property is not limited to a single layer and may be a stack of two or more layers containing any of the above substances.

For the hole-transport layer 702, a low-molecular compound having an excellent hole-transport property or a high-molecular compound having an excellent hole-transport property formed using a carbazole derivative or an anthracene derivative may be used.

(Organic Light-Emitting Layer)

For the organic light-emitting layer 703, a fluorescent compound, which exhibits fluorescence, or a phosphorescent compound, which exhibits phosphorescence, can be used. A fluorescent compound or a phosphorescent compound with which a desired emission color can be obtained may be used.

Note that the organic light-emitting layer 703 may have a structure in which a light-emitting organic compound (guest material) is dispersed in another substance (host material). By dispersing a guest material in a host material, concentration quenching due to high concentration of the guest material can be prevented. As the host material, various kinds of materials can be used. Note that it is preferable that the lowest unoccupied molecular orbital level (LUMO level) of the host material be higher than that of the guest material, and the highest occupied molecular orbital level (HOMO level) of the host material be lower than that of the guest material.

Plural kinds of materials can be used as the host material. For example, a high-volume material may be added for preventing crystallization of the host material. In addition, an assist dopant material may be added for efficiently transferring energy to the guest material. It is preferable that the LUMO level of the assist dopant material be higher than the LUMO level of the guest material and lower than the LUMO level of the host material. Moreover, it is preferable that the HOMO level of the assist dopant material be lower than the HOMO level of the guest material and higher than the HOMO level of the host material.

(Electron-Transport Layer)

The electron-transport layer 704 is a layer containing a substance having an excellent electron-transport property. For the electron-transport layer 704, a substance having an excellent electron-transport property can be used, and examples thereof are as follows: a metal quinolinol complex; an oxadiazole derivative; a triazole derivative; and a phenanthroline derivative like bathophenanthroline or bathocuproine, which is mainly used as a blocking material. Further, the electron-transport layer is not limited to a single layer and may be a stack of two or more layers containing any of the above substances.

(Electron-Injection Layer)

The electron-injection layer 705 is a layer containing a substance having an excellent electron-injection property. For the electron-injection layer 705, an alkali metal or an alkaline earth metal such as lithium, cesium, or calcium, a fluoride of an alkali metal or an alkaline earth metal such as lithium fluoride, cesium fluoride, or calcium fluoride, an acetylacetonate complex of an alkali metal or an alkaline earth metal such as a lithium acetylacetonate complex or a calcium acetylacetonate complex, or the like can be used. Any of the above substances for forming the electron-transport layer 704 can also be used.

Note that each of the above-described hole-injection layer 701, hole-transport layer 702, organic light-emitting layer 703, electron-transport layer 704, and electron-injection layer 705 can be formed by an evaporation method (including a vacuum evaporation method), an inkjet method, a spin coating method, or the like.

In this embodiment, the emission colors of the three EL layers in the light-emitting element are red, green, and blue, and thus the light-emitting element emits white light as a whole; however, a light-emitting element which has two EL layers whose emission colors are complementary colors and thus emits white light as a whole may be employed. Note that "complementary colors" refer to colors that can produce an achromatic color when mixed. That is, white light emission can be obtained by mixture of light from substances whose emission colors are complementary colors. Also in that case, the distance h between the reflective electrode layer 100 and the first conductive layer 101 can be set so that the intensity of light whose emission spectrum has relatively low intensity among emission spectra of emission colors is increased, and the ratio of the area of the first light-emitting element region 10 to that of the second light-emitting element region 20 can be set so that the light-emitting element as a whole emits desired white light having, for example, CIE chromaticity coordinates of (x=0.33, y=0.33) or white light with an excellent color rendering property.

Note that in one embodiment of the present invention, a light-emitting element including a plurality of EL layers (tandem light-emitting element) can be used as the EL layer 800. A structure example of the EL layer used in the tandem light-emitting element will be described in Embodiment 5.

[Embodiment 2]

Another structure of a light-emitting device according to one embodiment of the present invention will be described with reference to FIG. 3A.

Figure 3A:
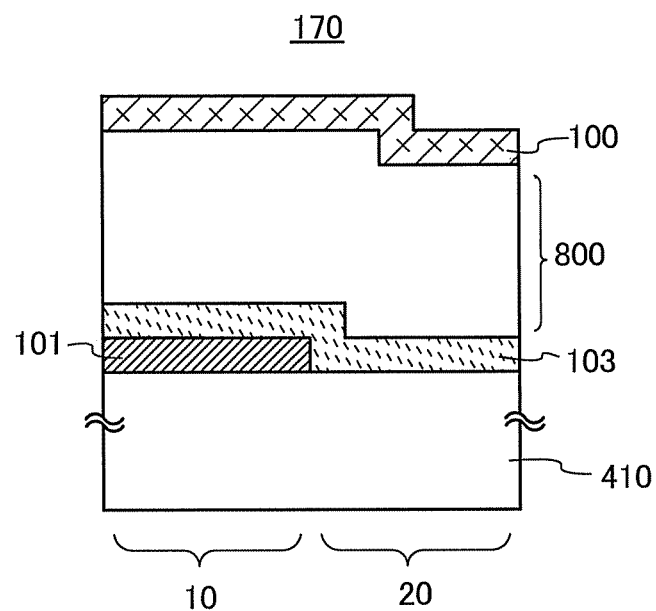
FIGS. 3A and 3B are cross-sectional views illustrating a light-emitting device according to one embodiment of the present invention.

FIG. 3A illustrates a light-emitting device 170, which is a cross-sectional view schematically illustrating a light-emitting device according to one embodiment of the present invention. A first light-emitting element region 10 includes a first conductive layer 101, a transparent conductive layer 103, an EL layer 800, and a reflective electrode layer 100. A second light-emitting element region 20 includes the transparent electrode layer 103, the EL layer 800, and the reflective electrode layer 100. The light-emitting device 170 can be supplied with power by being connected to an external power source through the first conductive layer 101 and the transparent conductive layer 103 as one electrode and the reflective electrode layer 100 as the other electrode.

The light-emitting device 170 is formed over a substrate 410. In the light-emitting device 170, light is extracted from the substrate 410 side.

In this embodiment, the EL layer 800 has an emission spectrum in wavelength regions of red light, green light, and blue light. For the details of the EL layer 800, refer to Embodiment 1.

In this embodiment, in the first light-emitting element region 10, the intensity of blue light emitted from an EL layer 800B is increased with a cavity effect generated by the reflective electrode layer 100 and the first conductive layer 101. For the method, refer to Embodiment 1.

<Light Emission from the Light-Emitting Device 170>

In an EL device emitting white light with the use of red light, green light, and blue light, when the intensity of blue light is lower than that of red light and that of green light, yellowish white light is emitted. In the case where the intensity of blue light is lower than that in natural light, the color rendering property of white light is poor. In general, in an EL element, the intensity of blue light tends to be lower than that of light of other colors. On the other hand, in the first light-emitting element region 10, the intensity of blue light is increased with the cavity effect as described above.

In the light-emitting device 170, light emission from the first light-emitting element region 10 and light emission from the second light-emitting element region 20 are performed concurrently; thus, light emission from the light-emitting device 170 is a combination of light emission from the first light-emitting element region 10 and light emission from the second light-emitting element region 20. With the cavity effect, the intensity of blue light is relatively increased in light emission from the first light-emitting element region 10. For that reason, in light emission from the light-emitting device 170, the intensity of blue light can be increased and a balance with emission spectra of other colors can be adjusted; therefore, emitted light from the light-emitting device 170 can be close to desired white light having, for example, CIE chromaticity coordinates of (x=0.33, y=0.33). Since the intensity of blue light becomes relatively high, the spectral shape in the visible light region is improved. As a result, white light emission with an excellent color rendering property can be provided.

In order that the light-emitting device as a whole emits light of a desired color tone or white light with an excellent color rendering property, the ratio of the area of the first light-emitting element region 10 to that of the second light-emitting element region 20 may be set so that the intensity of blue light has an appropriate value.

Although the intensity of blue light is increased in this embodiment, the method for obtaining desired white light emission is not limited to this; the distance h between the reflective electrode layer 100 and the first conductive layer 101 may be set so that the intensity of light in a specific wavelength region in an emission spectrum is increased. The ratio of the area of the first light-emitting element region 10 to that of the second light-emitting element region 20 may be set so that light emitted from the light-emitting device as a whole is close to desired white light having, for example, CIE chromaticity coordinates of (x=0.33, y=0.33), or so that the spectral shape of light emitted from the light-emitting device as a whole becomes that of white light close to natural light.

The first conductive layer 101 is preferably formed using a material whose electric resistance is lower than that of the transparent conductive layer 103. The first conductive layer 101 is formed so as to have a stripe shape or a grid shape in the light-emitting device, whereby voltage drop in the transparent conductive layer 103 in the light-emitting device can be prevented. As a result, a light-emitting device with less emission unevenness can be manufactured. In particular, such a structure is suitable for a lighting device with a large light-emitting area.

For the details of the layers included in the light-emitting device of this embodiment, refer to Embodiment 1.

[Embodiment 3]

Figure 4A:
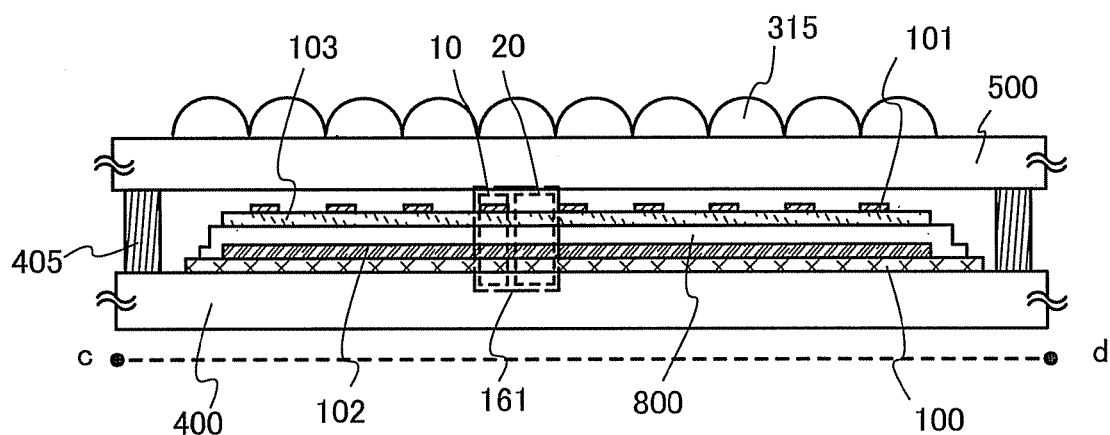
FIGS. 4A and 4B are a cross-sectional view and a plan view illustrating a lighting device according to one embodiment of the present invention.
Figure 4B:
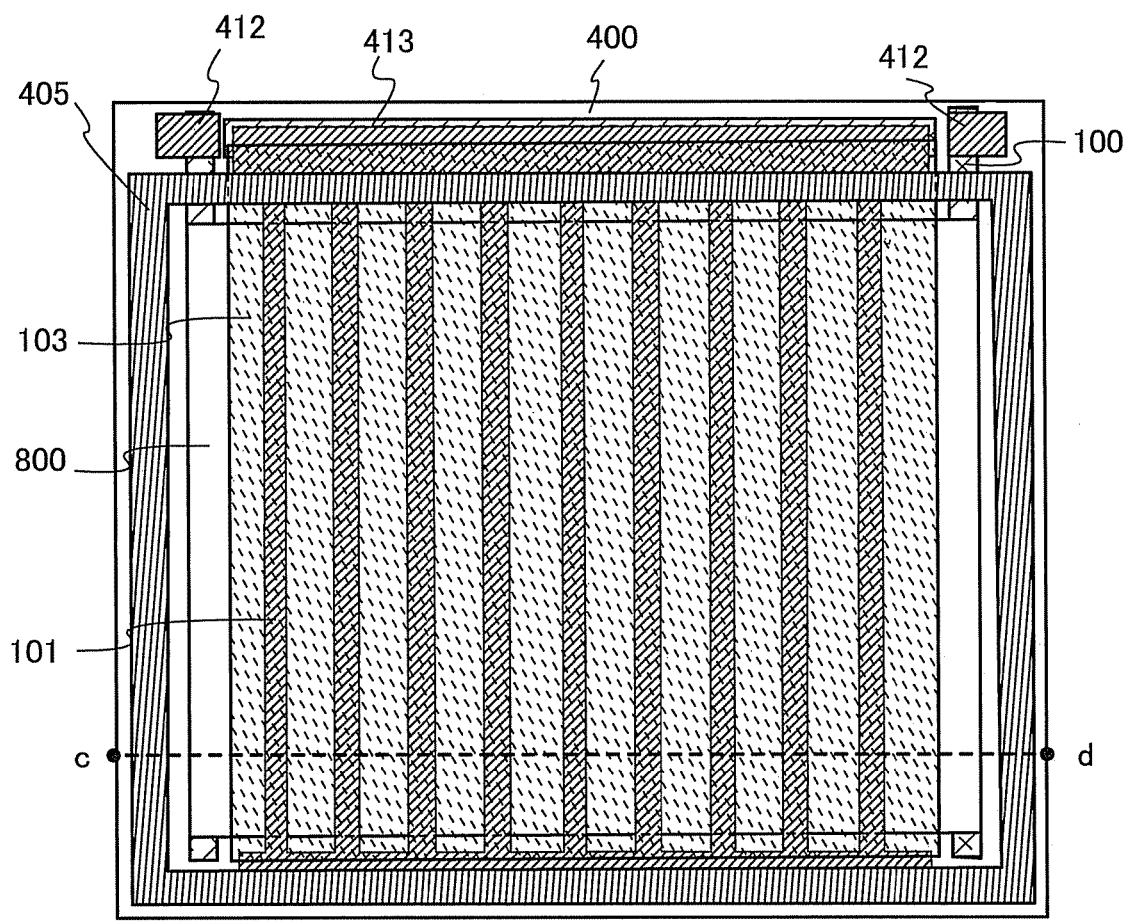

In this embodiment, a lighting device 260 including a light-emitting device according to one embodiment of the present invention will be described with reference to FIGS. 4A and 4B. FIG. 4B is a plan view of the lighting device, and FIG. 4A is a cross-sectional view taken along line c-d in FIG. 4B.

The lighting device 260 includes the light-emitting device 160 described in Embodiment 1. In the lighting device 260, a first light-emitting element region 10 and a second light-emitting element region 20 are provided. A region including the first light-emitting element region 10 and the second light-emitting element region 20 is defined as a light-emitting device 161. The first light-emitting element region 10 includes a reflective electrode layer 100, a second conductive layer 102, an EL layer 800, a transparent conductive layer 103, and a first conductive layer 101. The second light-emitting element region 20 includes the reflective electrode layer 100, the second conductive layer 102, the EL layer 800, and the transparent conductive layer 103. For the structures of the reflective electrode layer 100, the second conductive layer 102, the EL layer 800, the transparent conductive layer 103, and the first conductive layer 101, refer to Embodiment 1.

In the lighting device 260, the light-emitting device 161 is provided over a substrate 400, and is sealed between the substrate 400 and a counter substrate 500 with a sealant 405. The sealant 405 may be formed using an ultraviolet curable resin, an epoxy resin, frit glass, or the like by a dispenser method or a screen printing method. A lens array 315 is provided on a surface of the counter substrate 500 which does not face the substrate 400. The lens array 315 can be formed using an acrylic resin (PMMA), quartz, glass, or the like by a known method.

Part of the reflective electrode layer 100 extends to the outside of the sealant 405 to be electrically connected to a pad 412. Part of the transparent conductive layer 103 and part of the first conductive layer 101 extend to the outside of the sealant 405 to be electrically connected to a pad 413. Therefore, the pads 412 and 413 can be used as external input terminals.

In this embodiment, the case where the EL layer 800 is formed of three layers, an EL layer 800B, an EL layer 800G and an EL layer 800R, is described (FIG. 1B). The EL layer 800B emits blue light, the EL layer 800G emits green light, and the EL layer 800R emits red light.

In this embodiment, in the first light-emitting element region 10, the intensity of blue light emitted from the EL layer 800B is increased to be higher than the intensity of light of other colors with a cavity effect generated by the reflective electrode layer 100 and the first conductive layer 101. For the method, refer to Embodiment 1.

<Light Emission from the Lighting Device 260>

In an EL device emitting white light with the use of red light, green light, and blue light, for example, when the intensity of blue light is lower than that of red light and that of green light, yellowish white light is emitted. In the case where the intensity of blue light is lower than that in natural light, the color rendering property of white light is poor. In general, in an EL element, the intensity of blue light tends to be lower than that of light of other colors. On the other hand, in the first light-emitting element region 10, the intensity of blue light is relatively increased with the cavity effect as described above.

In the light-emitting device 161, light emission from the first light-emitting element region 10 and light emission from the second light-emitting element region 20 are performed concurrently; thus, light emission from the light-emitting device 161 is a combination of light emission from the first light-emitting element region 10 and light emission from the second light-emitting element region 20. With the cavity effect, the intensity of blue light is relatively increased in light emission from the first light-emitting region 10. For that reason, in light emission from the light-emitting device 161, the intensity of blue light can be increased and a balance with emission spectra of other colors can be adjusted; therefore, emitted light from the light-emitting device 161 can be desired white light having, for example, CIE chromaticity coordinates of (x=0.33, y=0.33). Since the intensity of blue light becomes relatively high, the spectral shape in the visible light region is improved. As a result, white light emission with an excellent color rendering property can be provided.

The lighting device 260 includes the light-emitting device 161. In order that the lighting device 260 emits light of a desired color tone or white light with an excellent color rendering property, the ratio of the area of the first light-emitting element region 10 to that of the second light-emitting element region 20 may be set so that the intensity of blue light has an appropriate value. In this manner, the arrangement in the light-emitting device 161 may be optimized.

The first conductive layer 101 is formed using a material whose electric resistance is lower than that of the transparent conductive layer 103. The first conductive layer 101 is formed so as to have a stripe shape or a grid shape in the light-emitting device, whereby voltage drop in the transparent conductive layer 103 in the light-emitting device can be prevented. As a result, a light-emitting device with less emission unevenness can be manufactured. In particular, such a structure is suitable for a lighting device with a large light-emitting area.

Although the first conductive layer 101 is formed so as to have a stripe shape in this embodiment, the first conductive layer 101 is not necessarily formed so as to have such a shape; the first conductive layer 101 may be formed so as to have a grid shape, or to have an island shape only in a desired region.

The lens array 315 is disposed so as to overlap with the first light-emitting element region and the second light-emitting element region. With the lens array 315, light emission from the first light-emitting element region 10 and light emission from the second light-emitting element region 20 can be effectively mixed, so that white light emission with an excellent color rendering property can be provided. Instead of the lens array, a diffusion sheet may be used.

The lighting device according to one embodiment of the present invention can emit white light with an excellent color rendering property and less emission unevenness.

[Embodiment 4]

In this embodiment, examples of a lighting device including a light-emitting device according to one embodiment of the present invention will be described with reference to FIGS. 5A and 5B.

According to one embodiment of the present invention, a lighting device in which a light-emitting portion has a curved surface can be achieved.

Figure 5A:
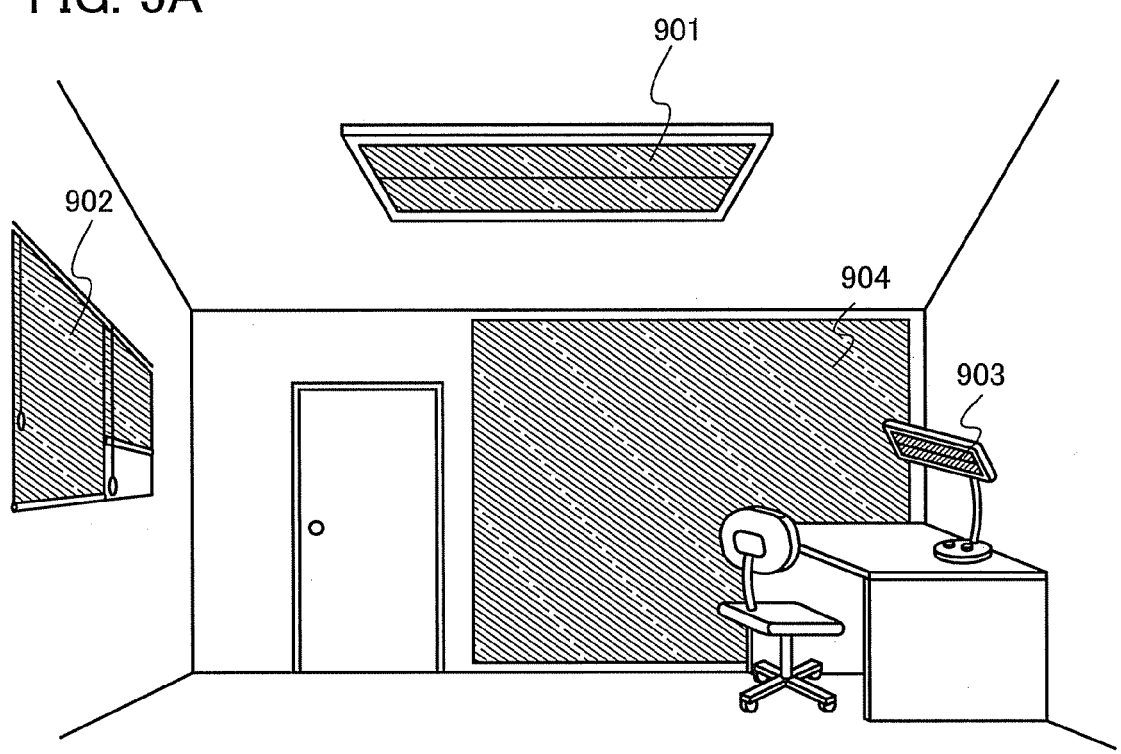
FIGS. 5A and 5B illustrate lighting devices according to one embodiment of the present invention.

FIG. 5A illustrates an interior lighting device 901, a desk lamp 903, and a planar lighting device 904 to which a light-emitting device according to one embodiment of the present invention is applied. Since the area of the light-emitting device can be increased, the light-emitting device can be used as a lighting device with a large area. Further, since the light-emitting device is thin, the light-emitting device can be mounted on a wall. Furthermore, the light-emitting device can be used as a roll-type lighting device 902.

Figure 5B:
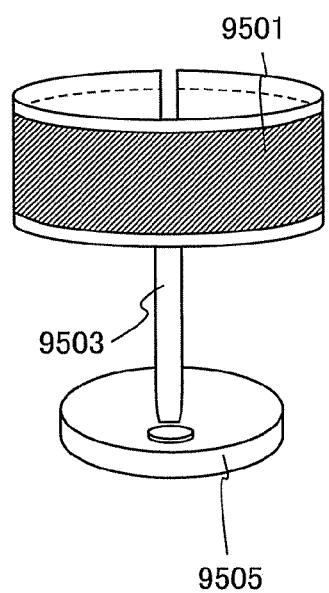

FIG. 5B illustrates another example of a lighting device. A desk lamp illustrated in FIG. 5B includes a lighting portion 9501, a support 9503, a support base 9505, and the like. The lighting portion 9501 includes a light-emitting device according to one embodiment of the present invention. According to one embodiment of the present invention, a lighting device having a curved surface or a lighting device including a flexible lighting portion can be achieved in this manner. The use of a flexible light-emitting device for a lighting device as described above not only improves the degree of freedom in design of the lighting device but also enables the lighting device to be mounted onto a portion having a curved surface, such as the ceiling or a dashboard of a car.

This embodiment can be implemented in appropriate combination with any of the other embodiments disclosed in this specification.

[Embodiment 5]

Figure 3B:
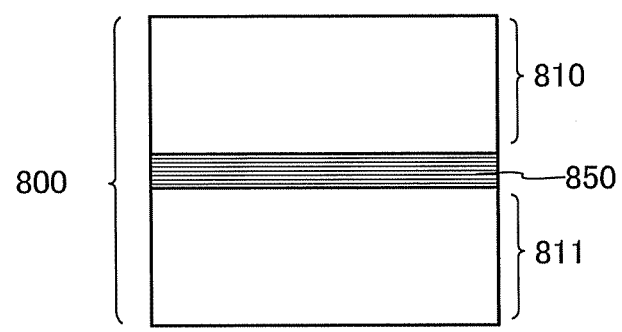

In this embodiment, a structure example of an EL layer used for a tandem light-emitting element that can be applied to one embodiment of the present invention will be described with reference to FIG. 3B.

In an EL layer 800 of a tandem light-emitting element, a charge generation layer 850 is provided between stacked EL layers 810 and 811. Each of the EL layers 810 and 811 may be formed using an EL layer with which desired light emission can be obtained; the EL layer described in Embodiment 1 may be used as appropriate. The charge generation layer 850 can be formed using the composite material described in Embodiment 1. Further, the charge generation layer 850 may have a layered structure including a layer containing the composite material and a layer containing another material. In that case, as the layer containing another material, a layer containing an electron donating substance and a substance having an excellent electron-transport property, a layer formed of a transparent conductive film, or the like can be used. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one EL layer and fluorescence from another EL layer can be easily obtained. Note that this structure can be combined with any of the above structures of the EL layer.

This application is based on Japanese Patent Application serial no. 2011-170906 filed with Japan Patent Office on Aug. 4, 2011, the entire contents of which are hereby incorporated by reference.

What is claimed is:
1. A light-emitting device comprising:
a reflective electrode;
an EL layer over the reflective electrode;
a transparent conductive layer comprising indium oxide over the EL layer; and
a first conductive layer having a semi-transmissive and semi-reflective property, wherein the first conductive layer is in contact with a first part of a top surface of the transparent conductive layer in a first region,
wherein the first conductive layer is not in contact with a second part of the top surface of the transparent conductive layer in a second region, and
wherein the EL layer is in contact with the transparent conductive layer in the first region and the second region.

2. The light-emitting device according to claim 1, wherein an electric resistance of the first conductive layer is lower than an electric resistance of the transparent conductive layer.

3. The light-emitting device according to claim 1, wherein an optical path length is adjusted so that an intensity of light in a specific wavelength region is relatively increased due to the first conductive layer, and
wherein an emission color of the first region and an emission color of the second region are complementary colors.

4. The light-emitting device according to claim 1, wherein an optical path length is adjusted so that an intensity of blue light is relatively increased due to the first conductive layer.

5. The light-emitting device according to claim 1, wherein a lens array is provided over the transparent conductive layer and the first conductive layer.

6. The light-emitting device according to claim 1, wherein the first conductive layer comprises an alloy of magnesium and silver or an alloy of magnesium and indium.

7. The light-emitting device according to claim 1, wherein the first conductive layer comprises an element belonging to Group 1 or Group 2 of the periodic table and aluminum.

8. The light-emitting device according to claim 1, wherein the light-emitting device further comprises a second conductive layer between the reflective electrode and the EL layer.

9. The light-emitting device according to claim 1, wherein the first conductive layer has a stripe shape or a grid shape.

10. A lighting device comprising the light-emitting device according to claim 1.

11. The light-emitting device according to claim 1, wherein the first conductive layer is in contact with a third part of the top surface of the transparent conductive layer in a third region,
wherein the EL layer is in contact with the transparent conductive layer in the third region, and
wherein the second region is between the first region and the third region.

12. A light-emitting device comprising:
a reflective electrode;
an EL layer over the reflective electrode, the EL layer comprising a first EL layer emitting blue light, a second EL layer emitting green light, and a third EL layer emitting red light overlapping with one another;
a transparent conductive layer comprising indium oxide over the EL layer; and
a first conductive layer having a semi-transmissive and semi-reflective property,
wherein the first conductive layer is in contact with a first part of a top surface of the transparent conductive layer in a first region,
wherein the first conductive layer is not in contact with a second part of the top surface of the transparent conductive layer in a second region, and
wherein the EL layer is in contact with the transparent conductive layer in the first region and the second region.

13. The light-emitting device according to claim 12, wherein an electric resistance of the first conductive layer is lower than an electric resistance of the transparent conductive layer.

14. The light-emitting device according to claim 12, wherein an optical path length is adjusted so that an intensity of light in a specific wavelength region is relatively increased due to the first conductive layer, and
wherein an emission color of the first region and an emission color of the second region are complementary colors.

15. The light-emitting device according to claim 12, wherein an optical path length is adjusted so that an intensity of the blue light is relatively increased due to the first conductive layer.

16. The light-emitting device according to claim 12, wherein a lens array is provided over the transparent conductive layer and the first conductive layer.

17. The light-emitting device according to claim 12, wherein the first conductive layer comprises an alloy of magnesium and silver or an alloy of magnesium and indium.

18. The light-emitting device according to claim 12, wherein the first conductive layer comprises an element belonging to Group 1 or Group 2 of the periodic table and aluminum 19. The light-emitting device according to claim 12, wherein the light-emitting device further comprises a second conductive layer between the reflective electrode and one of the first EL layer, the second EL layer, and the third EL layer.

20. The light-emitting device according to claim 12, wherein the first conductive layer has a stripe shape or a grid shape.

21. A lighting device comprising the light-emitting device according to claim 12.

22. The light-emitting device according to claim 12, wherein the first EL layer emits a light having an emission spectrum in which an intensity at a wavelength of 450 nm to 485 nm is higher than that at the other wavelengths of visible light, the second EL layer emits a light having an emission spectrum in which an intensity at a wavelength of 500 nm to 565 nm is higher than that at the other wavelengths of visible light, and the third EL layer emits a light having an emission spectrum in which an intensity at a wavelength of 600 nm to 740 nm is higher than that at the other wavelengths of visible light.

23. The light-emitting device according to claim 12, wherein the first conductive layer is in contact with a third part of the top surface of the transparent conductive layer in a third region,
wherein the EL layer is in contact with the transparent conductive layer in the third region, and
wherein the second region is between the first region and the third region.

* * * * *

UNITED STATES PATENT AND TRADEMARK OFFICE
CERTIFICATE OF CORRECTION

PATENT NO. : 8,823,030 B2  
APPLICATION NO. : 13/560046  
DATED : September 2, 2014  
INVENTOR(S) : Jinbo et al.

Page 1 of 1

It is certified that error appears in the above-identified patent and that said Letters Patent is hereby corrected as shown below:

In the Specification:

Column 3, Line 14; Change "can, be" to --can be--.

Column 4, Line 64; Change "8006," to --800G,--.

Column 5, Line 19; Change "be, h," to --be h,--.

Column 6, Line 59; Change "fanned" to --formed--.

Column 8, Line 20; Change "7026," to --702G,--.

Column 8, Line 21; Change "704Q" to --704G,--.

Column 12, Line 55; Change "800G" to --800G,--.

Signed and Sealed this  
Third Day of February, 2015

Michelle K. Lee  
*Deputy Director of the United States Patent and Trademark Office*